US006221176B1

(12) United States Patent
Merchant et al.

(10) Patent No.: US 6,221,176 B1
(45) Date of Patent: Apr. 24, 2001

(54) SURFACE TREATMENT OF COPPER TO PREVENT MICROCRACKING IN FLEXIBLE CIRCUITS

(75) Inventors: Harish D. Merchant, Hinckley; Charles A. Poutasse, Beachwood; Chin-Ho Lee, Lyndhurst, all of OH (US)

(73) Assignee: Gould Electronics, Inc., Eastlake, OH (US)

( * ) Notice: Subject to any disclaimer, the term of this patent is extended or adjusted under 35 U.S.C. 154(b) by 0 days.

(21) Appl. No.: 09/271,640

(22) Filed: Mar. 17, 1999

(51) Int. Cl.$^7$ .................................................. C23C 22/24
(52) U.S. Cl. .................. 148/264; 148/265; 148/269; 148/276; 148/277; 148/279; 148/282; 148/284
(58) Field of Search ........................... 148/251, 264, 148/265, 269, 276, 277, 279, 282, 284; 205/50; 428/209

(56) References Cited

U.S. PATENT DOCUMENTS

| | | | |
|---|---|---|---|
| 4,131,517 | * 12/1978 | Mitsuo et al. | 204/27 |
| 4,409,037 | * 10/1983 | Landau | 148/282 |
| 4,468,293 | * 8/1984 | Polan et al. | 204/27 |
| 4,524,089 | * 6/1985 | Haque et al. | 427/38 |
| 4,765,860 | 8/1988 | Ueno et al. | 156/272.6 |
| 4,863,808 | 9/1989 | Sallo | 428/601 |
| 4,902,551 | * 2/1990 | Nakaso et al. | 428/137 |
| 5,112,462 | 5/1992 | Swisher | 205/165 |
| 5,172,473 | * 12/1992 | Burns et al. | 29/885 |
| 5,230,932 | * 7/1993 | Chen et al. | 428/607 |
| 5,461,203 | 10/1995 | Blackwell et al. | 174/260 |
| 5,863,666 | * 1/1999 | Merchant et al. | 428/544 |

\* cited by examiner

*Primary Examiner*—John Sheehan
*Assistant Examiner*—Andrew L. Oltmans
(74) *Attorney, Agent, or Firm*—Michael A. Centanni

(57) ABSTRACT

In one embodiment, the present invention relates to a flexible laminate, comprising a first flexible polymeric film; a copper layer having a microcracking prevention layer on at least one side the microcracking prevention layer sufficient to prevent microcracks in a copper layer having a thickness of up to about 18 $\mu$m during at least 50,000,000 bending cycles and/or a copper layer having a thickness of up to about 35 $\mu$m during at least 20,000,000 bending cycles of the flexible laminate; and a second flexible polymeric film.

11 Claims, 1 Drawing Sheet

SURFACE TREATMENT OF COPPER TO PREVENT MICROCRACKING IN FLEXIBLE CIRCUITS

TECHNICAL FIELD

The present invention generally relates to flexible circuits having improved resistance to mechanical fatigue and to methods of making the foregoing improved flexible circuits. In particular, the present invention relates to treating the copper layer of a flexible circuit to prevent, minimize, and/or delay the propagation of microcracks in the copper foil layer of a flexible circuit.

BACKGROUND OF THE INVENTION

Flexible circuits are used in the electronics industry as the base materials for fabricating a wide variety of flexible interconnection products such as flexible circuit boards and flex-rigid circuit boards. Flexible circuit boards and flex-rigid circuit boards are used in notebook computers, printers and disc drives, as well as numerous medical devices and consumer products. Flexible circuits are also used for certain advanced applications such as chip-on-flex and fine-line circuit boards. With the electronics industry moving toward thinner, lighter, flexible and more functional products, the demand for flexible circuits continues to increase.

Flexible circuits are conventionally made of a copper layer (copper conductor) sandwiched between two organic polymeric layers. In particular, copper foil is bonded with a substrate, patterned, and a coverlayer is applied over the copper foil. As the name implies, flexible circuits maybe bent and unbent during use. Accordingly, it is desirable for the flexible circuit to possess a high degree of structural integrity in order to maintain electrical properties. Structural integrity provides resistance to mechanical fatigue caused by bending and unbending of the flexible circuit which leads to electrical failure.

The early indications of mechanical fatigue in flexible circuits are characterized by the generation and propagation of microscopic cracks at the surface of the copper foil layer. The microscopic cracks may extend into the thickness or across the width of the copper foil. As flexible circuits are used, the microscopic cracks eventually become cracks of notable size that can traverse the thickness of the copper foil or lead to gauging, wherein a small piece of copper foil at the surface of the copper foil layer is released. This type of damage to the copper foil layer, of course, leads to electrical failure.

The generation and propagation of cracks due to bending is referred to as "fatigue". There are three primary types of fatigue; namely, roll fatigue, flex fatigue, and fold fatigue. Roll fatigue is mainly attributable to two forces on the copper foil of the flexible circuit. Referring to FIG. 1, flexible circuit 10 is moved back and forth as indicated by arrows 12. This action mimics the motion of a disk drive. Arrows 14 represent tensile forces on the flexible circuit 10 (and particularly the copper foil, not shown, therein). Arrows 16 represent compressive forces on the flexible circuit 10 (and particularly the copper foil, not shown, therein). As the flexible circuit 10 is moved back and forth along arrow 12, the tensile forces and the compressive forces move back and forth thereon. The constantly repeated stress imposed by the tensile forces and the compressive forces leads to roll fatigue of the copper foil within flexible circuit 10. Flex fatigue is characterized by holding the flexible circuit at two points and applying force normal to the flexible circuit to a point about half way between the two holding points followed by applying another force normal to the flexible circuit in the opposite (180°) direction. Fold fatigue is characterized by initially holding the flexible circuit with a 135° bend and then folding the flexible circuit to have a 0°–2° bend and then unbending back to 135°. This action mimics the motion of a printer hinge.

The three primary types of fatigue (roll fatigue, flex fatigue, and fold fatigue) are generally caused by high cycle, low strain fatigue. Another type of fatigue is low cycle, high strain fatigue. It is difficult to provide a flexible circuit having resistance to both high cycle, low strain fatigue and low cycle, high strain fatigue.

Referring to FIGS. 2A and 2B, illustrations of microscopic cracks, some of which extend the thickness or the width of the copper foil and some of which do not, are shown. The illustrations are based on photographs taken at a magnification of 1600× of copper foil having a thickness of about 18 $\mu$m.

SUMMARY OF THE INVENTION

In one embodiment, the present invention relates to a flexible laminate, comprising a first flexible polymeric film; a copper layer having a microcracking prevention layer on at least one side the microcracking prevention layer sufficient to prevent microcracks in a copper layer having a thickness of up to about 18 $\mu$m during at least 50,000,000 bending cycles and/or a copper layer having a thickness of up to about 35 $\mu$m during at least 20,000,000 bending cycles of the flexible laminate; and a second flexible polymeric film.

In another embodiment, the present invention relates to a process for making a flexible laminate, comprising providing a copper layer; treating the copper layer to prevent microcracking; affixing a first side of the copper layer to a first flexible polymeric film; patterning the copper layer; and affixing a second flexible polymeric film to a second side of the copper layer.

In yet another embodiment, the present invention relates to a method of preventing microcracking in a copper layer having a thickness of up to about 18 $\mu$m during at least 50,000,000 bending cycles of a flexible circuit comprising a first flexible polymeric film, the copper layer, and a second flexible polymeric film, the flexible circuit optionally further comprising an adhesive between at least one of the copper layer and the first flexible polymeric film and the copper layer and the second flexible polymeric film, comprising treating at least one side of the copper layer with a cathodic treatment in an acidic copper sulfate bath, an oxidizing treatment, a chromium treatment, a cathodic treatment in an acid bath, a tie coat treatment and a silane treatment.

As a result of the present invention, a flexible circuit having improved electrical properties is provided. The flexible circuit having improved electrical properties exhibits improved resistance to mechanical fatigue and thus improved resistance to damage of the copper foil layer, thereby improving the electrical properties. The improved resistance to mechanical fatigue is attributable to the enhanced resistance to microcracking of the copper foil layer.

Also a result of the present invention, a flexible circuit having improved flex to install properties is provided. In this connection, the present invention provides a flexible circuit having resistance to both high cycle, low strain fatigue and low cycle, high strain fatigue.

DESCRIPTION OF THE PREFERRED EMBODIMENTS

Figure 1:
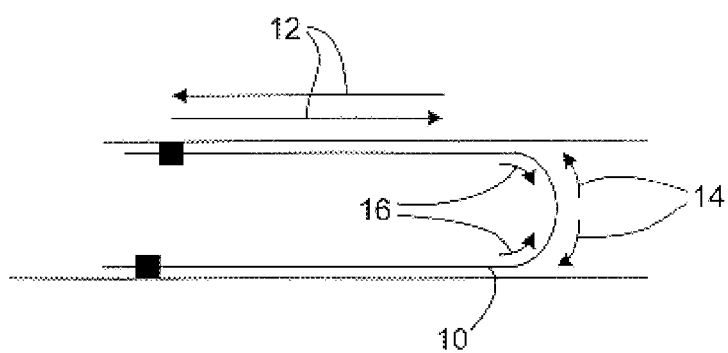
FIG. 1 is a schematic illustration of the bending and corresponding forces associated with a flexible circuit.
Figure 2A:
FIGS. 2A and 2B are illustrations of microcracking in a copper layer after numerous bending cycles.
Figure 2B:
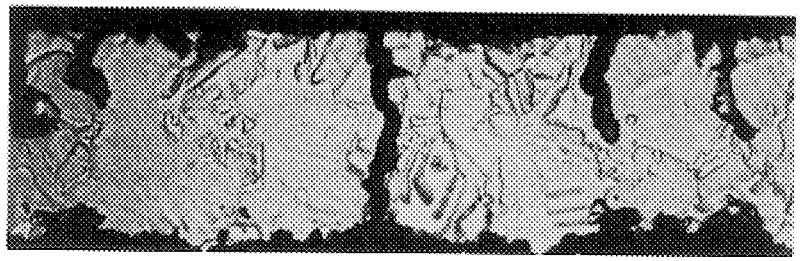

In one embodiment, the present invention relates to various treatments for the copper layer of a flexible circuit in order to prevent, minimize, and/or delay the propagation of microcracks due to the local imposition of energy from repeated bending and unbending cycles. In another embodiment, the present invention relates to flexible circuits containing a copper layer treated to prevent, minimize, and/or delay the generation and propagation of microcracks therein. While not wishing to be bound by any theory, it is believed that the various treatments for the copper layer of a flexible circuit reduce the energy locally imposed upon the copper layer, typically caused by tensile forces and/or compressive forces, by at least one of distributing the locally imposed energy over a relatively large area of the copper layer and absorbing locally imposed energy thereby reducing energy imposed upon the copper layer. By reducing the locally imposed energy, the propagation of microcracks in copper foil is prevented, minimized, and/or delayed. Locally imposed energy is stress or force applied on a relatively small portion of a substrate, characterized by a large force per unit area. The locally imposed energy is reduced by at least one of redistributing the locally imposed energy over a relatively large area of the copper layer (thereby decreasing the force per unit area on the copper layer and absorbing locally imposed energy thereby dissipating energy that would have been transferred to the copper layer.

Flexible circuits in accordance with the present invention contain a first flexible polymeric substrate or film, a copper layer having a microcracking prevention layer and a second flexible polymeric film or cover layer. The copper layer contains copper or a copper alloy. Copper alloys contain copper and at least one of the aluminum, chromium, zinc, gold, silver, palladium, platinum, nickel, cobalt, titanium, scandium and zirconium. Optionally, an adhesive is present in between the copper layer and at least one of the first flexible polymeric film and the second flexible polymeric film.

The copper treatments for preventing, minimizing, and/or delaying the propagation of microcracks include one or more of a cathodic treatment in an acidic copper sulfate bath, an oxidizing treatment, a chromium treatment, a zinc-oxidation treatment, and a cathodic treatment in an acid bath. In one embodiment, at least one of a tie coat treatment and a silane treatment are combined with one or more of the cathodic treatment in an acidic copper sulfate bath, the oxidizing treatment, the chromium treatment, a zinc-oxidation treatment, and the cathodic treatment in an acid bath. One or both sides of the copper foil may be treated in accordance with the invention.

Flexible circuits containing copper foil having a microcracking treatment layer in accordance with the present invention undergo substantially more bending cycles before microcracking occurs compared with flexible circuits that do not contain copper foil having the microcracking treatment layer (that is, they resist microcracking for a longer period of time). In one embodiment, flexible circuits containing copper foil having a microcracking treatment layer in accordance with the present invention undergo 25% more bending cycles before microcracking occurs compared with flexible circuits that do not contain copper foil having the microcracking treatment layer. In another embodiment, flexible circuits containing copper foil having a microcracking treatment layer in accordance with the present invention undergo 50% more bending cycles before microcracking occurs compared with flexible circuits that do not contain copper foil having the microcracking treatment layer. In yet another embodiment, flexible circuits containing copper foil having a microcracking treatment layer in accordance with the present invention undergo 100% more bending cycles before microcracking occurs compared with flexible circuits that do not contain copper foil having the microcracking treatment layer. In still yet another embodiment, flexible circuits containing copper foil having a microcracking treatment layer in accordance with the present invention undergo an order of magnitude more bending cycles before microcracking occurs compared with flexible circuits that do not contain copper foil having the microcracking treatment layer.

In one embodiment, the present invention permits the prevention of microcracking in a copper layer having a thickness of up to about 18 $\mu$m during at least 20,000,000 bending cycles of a flexible circuit (roll fatigue). In another embodiment, the present invention permits the prevention of microcracking in a copper layer having a thickness of up to about 18 $\mu$m during at least 50,000,000 bending cycles of a flexible circuit (roll fatigue). In yet another embodiment, the present invention permits the prevention of microcracking in a copper layer having a thickness of up to about 35 $\mu$m during at least 20,000,000 bending cycles of a flexible circuit (roll fatigue). In still yet another embodiment, the present invention permits the prevention of microcracking in a copper layer having a thickness of up to about 35 $\mu$m during at least 30,000,000 bending cycles of a flexible circuit (roll fatigue).

The copper treatment involving a cathodic treatment in an acidic copper sulfate bath functions to transfer local stress on the copper layer to a relatively large area on the copper layer. The acidic copper sulfate bath is typically at a temperature from about 5° C. to about 50° C., and preferably from about 10° C. to about 40° C. The acidic copper sulfate bath is preferably a dilute acidic copper sulfate bath. In this connection, the concentration of copper sulfate in the acidic copper sulfate bath is from about 0.1 g/l to about 60 g/l. In another embodiment, the concentration of copper sulfate is from about 1 g/l to about 30 g/l. In one embodiment, the resultant microcracking prevention layer of this embodiment has a thickness from about 0.01 $\mu$m to about 30 $\mu$m. In another embodiment, the resultant microcracking prevention layer of this embodiment has a thickness from about 0.1 $\mu$m to about 10 $\mu$m.

EXAMPLE 1

Two flexible laminates are provided, one conventional and one according to the present invention. The first flexible laminate (conventional) contains a copper layer having a thickness of about 18 $\mu$m, one adhesive layer next to one side of the copper foil having a thickness of about 25 $\mu$m, and two polyimide layers, one covering the adhesive layer having a thickness of about 25 $\mu$m, and the other having a thickness of about 50 $\mu$m attached directly to the copper layer. The second flexible laminate (according to the present invention) also contains a copper layer having a thickness of about 18 $\mu$m, one adhesive layer next to the one side of the copper foil having a thickness of about 25 $\mu$m, and two polyimide layers, one covering the adhesive layer having a thickness of about 25 $\mu$m, the other having a thickness of about 50 $\mu$m attached directly to the copper layer, but one side of the copper layer is contacted with an acidic copper sulfate bath containing about 50 g/l of copper sulfate at a temperature of about 30° C. for a time sufficient to form a microcracking prevention layer having a thickness of about 1 μm.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 20,000,000 cycles and extensive microcracking (some through the copper foil) at 40,000,000 cycles.

The copper treatment involving an oxidizing treatment involves the use of an oxidant to oxidize the surface of the copper layer of the flexible circuit. The oxidizing treatment functions to distribute locally imposed energy over a relatively large area of the copper layer and/or absorb locally imposed energy thereby dissipating energy going to the copper layer.

In one embodiment, the oxidizing treatment involves providing brown oxide on the copper layer surface. In another embodiment, the oxidizing treatment involves providing a black oxide layer on the surface of the copper layer of the flexible circuit. Brown and black oxides are provided by contacting an oxidant with the surface of the copper layer preferably in the presence of an electric current. Common oxidants include chlorite, sulfite, hypochlorite and hyposulfite. Typically, the black oxide layer is obtained after a more thorough oxidation of the copper foil compared to the oxidation of the black oxide. Brown or black oxides are obtained depending upon at least one of the concentration of the oxidant and the time in which the copper foil is in contact with the oxidant. In embodiments where a brown oxide is desired, the concentration of the oxidant is from about 10 g/l to about 100 g/l, and preferably from about 15 g/l to about 30 g/l. In embodiments where a black oxide is desired, the concentration of the oxidant is from about 40 g/l to about 150 g/l, and preferably from about 40 g/l to about 60 g/l. In embodiments where a brown oxide is desired, the copper foil is in contact with an oxidant solution from about 10 seconds to about 3 minutes, and preferably from about 30 seconds to about 90 seconds. In embodiments where a black oxide is desired, the copper foil is in contact with an oxidant solution from about 3 minutes to about 10 minutes, and preferably from about 5 minutes to about 7 minutes. In these embodiments, the thickness of the brown oxide layer is from about 0.01 μm to about 1 μm and the thickness of the black oxide layer is from about 0.02 μm to about 2 μm. In another embodiment, the thickness of the brown oxide layer is from about 0.05 μm to about 0.2 μm and the thickness of the black oxide layer is from about 0.07 μm to about 0.5 μm.

EXAMPLE 2

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with an oxidizing solution containing about 50 g/l of sodium hypochlorite for about 6 minutes to provide a black oxide layer.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 20,000,000 cycles and extensive microcracking (some through the copper foil) at 25,000,000 cycles.

EXAMPLE 3

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with an oxidizing solution containing about 20 g/l of sodium hypochlorite for about 60 seconds to provide a brown oxide layer.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 25,000,000 cycles and extensive microcracking (some through the copper foil) at 30,000,000 cycles.

In another embodiment, the brown oxide is provided by contacting the copper foil with a solution of an oxidizer and a hydroxide compound. The copper foil is contacted with this solution via any conventional means including dipping, spraying, wiping, immersing and the like, although immersing the copper foil in this solution is preferred. Application of an electrical current is not required.

In this embodiment, the temperature of the solution is from about 10° C. to about 90° C., and more preferably from about 40° C. to about 80° C. In one embodiment, the copper foil is placed in the oxidizer solution from about 2 to about 20 seconds, and more preferably from about 5 to about 10 seconds.

The oxidizer is a chemical compound capable of oxidizing the surface of the copper foil. Oxidizers include ammonium, alkali metal and alkaline earth metal oxidizers. The term "ammonium" as used herein includes both ammonium ions ($NH_4^+$) and organic ammonium ions such as tetramethylammonium, tetraethylammonium, tetrapropylammonium and tetrabutylammonium ions. Alkali metals include lithium, sodium, potassium and rubidium, sodium and potassium being preferred. Alkaline earth metals include beryllium, magnesium, calcium, strontium and barium, magnesium and calcium being preferred. Examples of oxidizers include ammonium, alkali metal and alkaline earth metal, chlorites, hypochlorites, nitrates, nitrites, percarbonates, perborates, perchlorates, periodates and persulfates.

Specific examples include ammonium nitrate, ammonium perchlorate, ammonium persulfate, tetramethylammonium nitrate, tetraethylammonium nitrate, sodium chlorite, sodium hypochlorite, sodium nitrate, sodium nitrite, sodium perborate, sodium percarbonate, sodium perchlorate, sodium periodate, sodium persulfate, potassium nitrate, potassium nitrite, potassium perborate, potassium perchlorate, potassium periodate, potassium persulfate, rubidium nitrate, rubidium perchlorate, magnesium nitrate, magnesium perchlorate, calcium hypochlorite, calcium nitrate, calcium perchlorate, strontium nitrate, and strontium perchlorate. Preferred oxidizers include sodium hypochlorite, sodium chlorite and sodium persulfate. The oxidizer is present in the solution an amount ranging from about 20 to about 180 g/l, and preferably from about 30 to about 170 g/l, and more preferably from about 50 to about 160 g/l.

The hydroxide compound is any compound capable of providing hydroxide ions in solution. Examples of hydroxide compounds include ammonium, alkali metal and alkaline earth metal hydroxides. Specific examples of hydroxide compounds include ammonium hydroxide, tetramethylammonium hydroxide, tetraethylammonium hydroxide, sodium hydroxide, potassium hydroxide, magnesium hydroxide, and calcium hydroxide. The hydroxide compound is present in the solution in an amount less than about 5 g/l, preferably less than about 3 g/l, more preferably less than about 2 g/l, and more preferably less than about 1.5 g/l.

In this embodiment, the oxidizer solution contains a suitable solvent such as water, polar organic liquids such as alcohols and glycols, and/or mixtures thereof. Aqueous solutions are preferred. Various additives may also be contained in the oxidizer solution.

In one embodiment, the ratio in g/l of the oxidizer to the hydroxide compound is at least about 20:1. In another embodiment, the ratio of the oxidizer to the hydroxide compound is at least about 30:1. In a preferred embodiment, the ratio of the oxidizer to the hydroxide compound is at least about 50:1. In a most preferred embodiment, the ratio of the oxidizer to the hydroxide compound is at least about 60:1. In these embodiments, the ratio is necessary for proper interaction between the oxidizing solution and the metal foil.

In this embodiment, the oxide layer has a thickness from about 50 to about 250 Å, but less than about 250 Å. In another embodiment, the thickness of the resultant oxide layer on the copper foil is from about 75 to about 200 Å, but less than about 200 Å. In yet another embodiment, the thickness of the resultant oxide layer on the copper foil is from about 100 to about 175 Å, but less than about 175 Å.

The solution containing the oxidizer leads to the formation of an oxide layer on the copper foil. As a result of the relatively low amount of hydroxide compound present in the solution, the quality of the oxide layer for dissipating tensile stress and compressive stress is increased without electrolytically treating the copper foil.

EXAMPLE 4

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with an oxidizing solution containing about 90 g/l of sodium hypochlorite and about 2 g/l sodium hydroxide at about 50° C. for about 7 seconds to provide a brown oxide layer.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 25,000,000 cycles and extensive microcracking (some through the copper foil) at 30,000,000 cycles.

In yet another embodiment, plasma may be applied to the copper foil surface for an effective period of time and at a sufficient level of intensity to chemically modify the surface, and thereby enhancing resistance to microcracking. The plasma used to treat the film surface is comprised of ionized oxygen that is produced using a non-metallizing cathode. The term "non-metallizing cathode" refers to cathodes that do not deposit significant levels of metal or metal oxide on the surface of the copper layer. The term "significant levels" refers to levels of no more than about 0.1 atomic percent as measured by x-ray photoelectron spectroscopy. The non-metallizing cathodes include non-metallic cathodes such as carbon cathodes. In one embodiment, certain metal cathodes such as cathodes constructed of Al, Ti, V, and mixtures of two or more thereof can be used. Carbon cathodes are preferred. Direct current or alternating current can be used, with direct current being preferred. The plasma gas can be oxygen, air or gaseous mixtures containing oxygen at a concentration of up to about 100%, and in one embodiment about 15% to about 100%, and one or more second gases (e.g., $N_2$, Ar, Kr, $NH_3$, $N_2O$, $CF_4$, $CO_2$ or one or more noble gases). In one embodiment, the plasma gas is oxygen or air. The pressure in the plasma chamber is typically in the range of about 10 to about 500 mTorr, and in one embodiment about 20 mTorr to about 200 mTorr, and in one embodiment about 30 mTorr to about 150 mTorr, and in one embodiment about 40 to about 100 mTorr. The discharge power density is in the range of about 0.1 to about 8 $W/cm^2$, and in one embodiment about 0.17 to about 6.2 $W/cm^2$, and in one embodiment about 0.34 to about 2.41 $W/cm^2$. The total energy input into the surface is in the range of about 0.02 to about 150 $J/cm^2$, and in one embodiment about 0.05 to about 113 $J/cm^2$, and in one embodiment about 0.4 to about 11.3 $J/cm^2$.

The copper layer can be subjected to one or more than one plasma treatment steps. In this embodiment, the oxidizing treatment involves contacting oxygen plasma with the surface of the copper layer of the flexible circuit to form an oxide layer having a thickness from about 0.01 μm to about 5 μm, and preferably from about 0.1 μm to about 1 μm.

EXAMPLE 5

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with an oxidizing plasma containing oxygen at 150 mTorr using a discharge power density of about 4 $W/cm^2$.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 30,000,000 cycles and extensive microcracking (some through the copper foil) at 40,000,000 cycles.

In still yet another embodiment, the oxidizing treatment involves a mild oxidation treatment in a solution of aerated water. The solution contains water having a sufficient amount of dissolved oxygen therein to oxidize the surface of the copper foil. In this embodiment, the temperature of the aerated water solution is from about 2° C. to about 50° C. In another embodiment, the temperature of the aerated water oxidizer solution is from about 10° C. to about 40° C. In yet another embodiment, the temperature of the aerated water solution is from about 15° C. to about 30° C. In one embodiment, the copper foil is contacted with the aerated water solution from about 1 to about 100 seconds. In another embodiment, the copper foil is contacted with the aerated water solution from about 2 to about 50 seconds. In yet another embodiment, the metal foil is contacted with the aerated water solution from about 5 to about 25 seconds.

In a preferred embodiment, the water is deionized water, although tap water may be used. The water of the aerated water solution contains at least about 7 ppm dissolved oxygen. In a preferred embodiment, the water of the aerated water solution contains at least about 7.5 ppm dissolved oxygen. In one embodiment, the water contains from about 8 ppm to about 20 ppm dissolved oxygen. In another embodiment, the water contains from about 9 ppm to about 15 ppm. Water containing the specified levels of dissolved oxygen may be obtained by acquiring water with relatively high levels of dissolved oxygen or aerating water with pure oxygen gas or a gas containing oxygen until the desired dissolved oxygen level is reached. Gases containing oxygen include air and mixtures of oxygen and one or more of inert and nonreactive gases such as hydrogen, nitrogen, helium, neon, argon, krypton and xenon. During the inventive process, the aerated water solution may be periodically or continually aerated to maintain a desired minimum level or range of dissolved oxygen.

The oxygen level of the aerated water solution may be periodically or continually measured using any known means to measure dissolved oxygen content. For example, one apparatus is under the trade designation YSI Model 57 Series Dissolved Oxygen Meter from Yellow Springs Instrument Company. Reagent methods, based on the Winkler method, may also be employed. Dissolved oxygen reagent sets, using buret titration methods, digital titrator methods, or drop count titration methods, dissolved oxygen reagent AccuVac® ampuls, and Pocket Colorimeter™ for dissolved oxygen are available from Hach Company.

In this embodiment, the aerated water solution is optionally metal free; that is, the aerated water solution is characterized by the absence of added metals or metal compounds. Trace amounts of metals or metal compounds in tap water and deionized water may be tolerated. In another embodiment, the aerated water solution is free of organic solvents; that is, the aerated water solution is characterized by the absence of added organic solvents. In yet another embodiment, small amounts (less than about 2% by weight or less than about 1% by weight) of organic solvents may be present in the tap or deionized water.

The oxide layer formed due to contact of the copper foil with the aerated water solution is very thin. In another embodiment, the oxide layer has a thickness from about 1 to about 25 Å, but less than about 25 Å. In another embodiment, the thickness of the resultant oxide layer on the copper foil is from about 2 to about 20 Å, but less than about 20 Å. In another embodiment, the thickness of the resultant oxide layer on the copper foil is from about 3 to about 15 Å, but less than about 15 Å.

The aerated water solution containing water and at least 7 ppm dissolved oxygen leads to the formation of a relatively thin oxide layer on the copper foil. As a result of the specific amount of dissolved oxygen present in the solution, the quality of the oxide layer is increased without electrolytically treating the copper foil.

EXAMPLE 6

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with an oxidizing solution containing about 12 ppm dissolved oxygen at about 30° C. for about 20 seconds to provide a thin brown oxide layer.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 25,000,000 cycles and extensive microcracking (some through the copper foil) at 30,000,000 cycles.

The copper treatment involving a chromium treatment functions to distribute locally imposed energy over a relatively large area of the copper layer and/or absorb locally imposed energy thereby dissipating energy going to the copper layer. In one embodiment, the chromium treatment involves contacting the copper layer with a chromate ($CrO_3$) solution. This may be accomplished by spraying or dipping the copper layer in a chromate solution. Chromate may be derived from a number of sources including potassium chromate and magnesium chromate. In one embodiment, the concentration of chromate in the chromate solution is from about 0.1 g/l to about 10 g/l. In another embodiment, the concentration of chromate in the chromate solution is from about 1 g/l to about 5 g/l. In one embodiment, the copper foil is in contact with the chromate solution from about 1 seconds to about 100 seconds, and preferably from about 3 seconds to about 10 minutes.

EXAMPLE 7

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with a chromate solution containing about 2 g/l of chromate at a temperature of about 25° C. for about 7 seconds.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 20,000,000 cycles and extensive microcracking (some through the copper foil) at 30,000,000 cycles.

In another embodiment, the chromate treatment involves a cathodic treatment in a chromate solution. In particular, copper foil is placed in a chromium containing electrolytic bath. The chromium containing electrolytic bath is an aqueous solution containing a chromium compound and optionally performance enhancing additives. A current is applied to the bath so that a cathodic chrome layer is electrolytically deposited on the copper foil. The chromium compound is any compound capable of depositing a thin layer of cathodic chrome or chromium onto the copper foil. Examples of chromium compounds include chromium oxide such as chromium trioxide, chromium anhydride, chromic acid, hexavalent chromium compounds, dichromates such as potassium dichromate and sodium dichromate, and chromates such as potassium chromate, sodium chromate and magnesium chromate. The chromium compound is present in the chromium containing electrolytic bath in an amount from about 0.1 to about 5 g/l, and preferably from about 1 to about 3 g/l.

Optional performance enhancing additives include zinc compounds, such as zinc salts (for example, zinc acetate, zinc chloride, zinc nitrate and zinc sulfate).

In one embodiment, the temperature of the chrome containing electrolytic bath during the electrodeposition step is from about 15° C. to about 30° C., and preferably from about 20° C. to about 25° C. The pH of the chromium containing electrolytic bath depends upon the identity of the particular chromium compound of a specific embodiment, and thus is not critical. In one embodiment, the current density applied to the chromium containing electrolytic bath is from about 10 to about 40 ASF. In another embodiment, the current density is from about 15 to about 35 ASF, and more preferably from about 20 to about 30 ASF. The copper foil is placed in the chromium containing electrolytic bath for a time sufficient to permit the formation of a relatively thin but uniform cathodic chrome layer over the copper foil surface. In one embodiment, the copper foil is placed in the chromium containing electrolytic bath from about 2 to about 20 seconds, and more preferably from about 5 to about 10 seconds.

In one embodiment, the thickness of the resultant cathodic chrome layer is from about 25 to about 125 Å. In a preferred embodiment, the thickness of the resultant cathodic chrome layer is from about 50 to about 100 Å. The thickness of the cathodic chrome layer is substantially uniform over the entire surface of the copper foil and follows any contours on the surface of the copper foil.

EXAMPLE 8

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with a chromium containing electrolytic bath containing about 3 g/l chromium at a temperature of about 25° C. for about 10 seconds under 25 ASF.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 30,000,000 cycles and extensive microcracking (some through the copper foil) at 40,000,000 cycles.

In yet another embodiment, the chromium treatment may involve a cathodic treatment in an acidic chromate solution containing zinc and a hydrogen inhibitor such as phosphorous. The chromium treatment applies a metal layer to the copper foil by contacting the copper foil with an electrolyte solution comprising zinc ions, chromium ions and at least one hydrogen inhibitor. The source of zinc ions for the electrolyte solution can be any zinc salt. Examples include $ZnSO_4$, $ZnCO_3$, $ZnCrO_4$, zinc polyphosphate, zinc sulfamate, etc. The source of chromium ions for the electrolyte solution can be any hexavalent chromium salt or compound, examples include $ZnCrO_4$, $CrO_3$, chromium trioxide, chromium anhydride, hexavalent chromium compounds, dichromates such as potassium dichromate and sodium dichromate, and chromates such as potassium chromate, sodium chromate and magnesium chromate.

The hydrogen inhibitor can be any additive for the electrolyte solution in this embodiment that inhibits hydrogen evolution during the application process. These include the following ions: $P^{+3}$, $W^{+6}$, $V^{+5}$, $As^{+5}$, $As^{+3}$, $Pb^{+2}$, $Pb^{+4}$, $Hg^{+1}$, $Hg^{+2}$, $Cd^{+2}$ or quaternary ammonium ions. $P^{+3}$, $W^{+6}$ and $V^{+5}$ are particularly preferred, and $P^{+3}$ is especially preferred. Sources for these ions include $H_3PO_3$, $Na_2WO_4$, $Na_3VO_4$ $HAsO_3$, $Pb(NO_3)_2$, $Pb(NO_3)_4$, $Hg_2SO_4$, $HgSO_4$, $CdSO_4$, and the like.

The quaternary ammonium ions can be any compound or cation derived from the formula

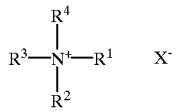

wherein $R^1$, $R^2$, $R^3$ and $R^4$ are independently hydrocarbon groups of 1 to about 16 carbon atoms, and in one embodiment 1 to about 8 carbon atoms, and in one embodiment about 4 carbon atoms, and $X^-$ is an anion such as $Cl^-$, $OH^-$, carbonate, bicarbonate, nitrate or other such anion, which acts as a counterion to the quaternary ammonium. A particularly preferred quaternary ion includes tetrabutyl ammonium ions derived from tetrabutyl ammonium hydroxide.

The concentration of zinc ions in the electrolyte solution is generally in the range from about 0.1 to about 2 g/l, and in one embodiment about 0.3 to about 1 g/l, and in another embodiment about 0.4 to about 0.5 g/l. The concentration of chromium ions in the electrolyte solution is generally in the range from about 0.3 to about 5 g/l, and in one embodiment about 0.5 to about 3 g/l, and in another embodiment about 0.5 to about 1.0 g/l. The concentration of hydrogen inhibitor ions is generally in the range from about 5 ppm to about 1000 ppm, and in one embodiment about 100 ppm to about 500 ppm. In one embodiment, the concentration of $P^{+3}$ ions in the electrolyte solution is in the range of about 100 ppm to about 500 ppm, and in one embodiment about 150 ppm to about 250 ppm.

The electrolyte solution can include other additives such as $Na_2SO_4$ at concentrations in the range from about 1 to about 50 g/l, and in one embodiment about 10 to about 20 g/l. The pH of the electrolyte solution is generally in the range from about 3 to about 6, and in one embodiment about 4 to about 5. The current density employed is generally in the range from about 1 to about 100 amps/ft², and in one embodiment about 25 to about 50 amps/ft², and in another embodiment about 30 amps/ft².

The temperature of the electrolyte solution is generally in the range from about 20° C. to about 100° C., and in one embodiment about 25° C. to about 45° C. The plating time employed is generally in the range from about 1 to about 30 seconds, and in one embodiment about 5 to about 20 seconds. In one embodiment, the total treatment time is from about 1 to about 10 seconds, and in another embodiment, the total treatment time is from about 2 to about 8 seconds.

In one embodiment, the mole ratio of chromium ions to zinc ions in the electrolyte solution is in the range from about 0.2 to about 10, and in one embodiment about 1 to about 5. The mole ratio of zinc ions to hydrogen inhibitor ions in the electrolyte solution is, in one embodiment, in the range from about 0.4 to about 10, and in one embodiment about 1 to about 2.

The thickness of the resultant layer that is applied to the copper foil is generally in the range from about 0.001 to about 0.5 microns, and in one embodiment about 0.005 to about 0.01 microns.

EXAMPLE 9

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted with an acidic electrolytic bath containing about 0.5 g/l zinc, about 2 g/l chromium and about 200 ppm phosphorus at a temperature of about 25° C. for about 10 seconds under 30 ASF.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 35,000,000 cycles and extensive microcracking (some through the copper foil) at 45,000,000 cycles.

The copper treatment may involve a zinc-oxidation treatment. The zinc-oxidation treatment forms a zinc oxide that functions to distribute locally imposed energy over a relatively large area of the copper layer and/or absorb locally imposed energy thereby dissipating energy going to the copper layer.

In one embodiment, a zinc metal layer is deposited on the copper foil, followed by oxidation into a zinc oxide layer. The zinc metal layer has a thickness of about 2 Å to about 60 Å, and in another embodiment about 2 Å to about 50 Å, and in yet another embodiment about 5 Å to about 40 Å, and in still yet another embodiment about 10 Å to about 35 Å.

In one embodiment, the layer of zinc metal is applied to the copper foil surface using vapor deposition. Any of the vapor deposition techniques known in the art can be used. These include physical vapor deposition (PVD) and chemical vapor deposition (CVD) techniques. Physical vapor deposition includes thermal evaporation, electron beam deposition, inductive and/or resistive deposition, ion plating, sputtering, plasma-activated evaporation, reactive evaporation, and activated reactive evaporation. Physical vapor deposition also has been referred to in the literature as vacuum metallization and evaporative coating. In thermal evaporation deposition procedures, the zinc metal to be applied to the copper foil is heated in a high vacuum (e.g., $10^{-2}$ to about $10^{-6}$ torr) whereupon the zinc metal evaporates or sublimates and travels to the copper foil surface. In sputtering processes, energetic inert ions created in a plasma discharge impact a target and cause the ejection of zinc metal through momentum exchange. Physical vapor deposition essentially involves the transfer of the zinc metal and the formation of a zinc layer on the copper foil by physical means alone in contrast to chemical vapor deposition in which the zinc metal transfer is effected by chemical reactions induced by temperature or concentration gradients between the substrate and the surrounding gaseous atmosphere. The principals of vapor deposition and procedures useful in vapor depositing various metals is described in *Vapor Deposition,* edited by C. F. Powell et al., John Wiley & Sons, Inc., New York, 1966, which is incorporated herein by reference.

Chemical vapor deposition usually is accomplished by vaporizing a zinc halide and decomposing or reacting the vapors at the foil surface to yield a non-volatile zinc metal on the surface of the foil as a coating. The chemical reactions of vapor deposition can be effected by thermal deposition or pyrolysis, hydrogen reduction, reduction with metal vapors, reaction with the copper foil, chemical transport reactions, etc. These procedures are described in detail in Chapter 9 of *Vapor Deposition,* C. F. Powell, et al., J. Wiley & Sons, Inc., New York, 1966. This chapter is incorporated herein by reference for its description of the CVD processes.

The zinc metal layer is oxidized by applying a hexavalent chromium oxide layer to its surface using known electroplating techniques. During this process the hexavalent chromium oxide is converted or reduced to trivalent chromium oxide. The resulting trivalent chromium oxide layer has a thickness of about 20 Å to about 100 Å, and in one embodiment about 20 Å to about 60 Å, and in another embodiment about 30 Å to about 40 Å. The source of hexavalent chromium oxide can be chromium trioxide ($CrO_3$), a chromyl ($CrO_2^{++}$) compound such as chromyl amide ($CrO_2(NH_2)_2$) or chromylchloride ($CrO_2Cl_2$), a chromate ($CrO_4^=$) compound such as $Na_2CrO_4$ or $K_2CrO_4$, or a dichromate ($Cr_2O_7^=$) compound such as $Na_2Cr_2O_7$ or $K_2Cr_2O_7$. The concentration of hexavalent chromium oxide compounds in the electrolyte solution is generally in the range of about 1 to about 5 g/l, and in one embodiment about 2 to about 4 g/l, and in another embodiment about 3 g/l. The electrolyte solution can include other conventional additives such as $Na_2SO_4$ at concentrations in the range of about up to about 15 g/l, and in one embodiment 1 to about 15 g/l. The pH used in the electrolyte solution is generally in the range of about 1.5 to about 9. The current density is generally in the range of about 2 to about 20 amps/ft$^2$, and in one embodiment about 10 to about 20 amps/ft$^2$. The temperature of the electrolyte solution is generally in the range of about 20 to about 50° C., and in one embodiment about 35 to about 40 ° C. The plating time that is used is generally in the range of about 2 to about 15 seconds, and in one embodiment about 5 to about 12 seconds.

The layer of zinc oxide has a thickness of about 3 Å to about 80 Å, and in one embodiment about 5 Å to about 60 Å, and in another embodiment about 10 Å to about 50 Å, and in yet another embodiment about 15 Å to about 40 Å, and in still yet another embodiment about 20 Å to about 35 Å.

EXAMPLE 10

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that one side of the copper layer is contacted by vapor deposition with zinc to a depth of about 60 Å. Then, the zinc treated copper foil is contacted with 3 g/l hexavalent chromium oxide electrolyte solution under 15 ASF at about 40° C. for about 10 seconds.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 40,000,000 cycles and extensive microcracking (some through the copper foil) at 55,000,000 cycles.

The copper treatment may involve the deposition of a tie coat in combination with one of the preceding copper treatments. The tie coat functions to distribute locally imposed energy over a relatively large area of the copper layer and/or absorb locally imposed energy thereby dissipating energy going to the copper layer. The deposition of a tie coat generally involves a metal deposition step.

In one embodiment, the tie coat deposition involves depositing a chrome tie coat. In another embodiment, the tie coat treatment involves depositing a nickel tie coat. The chrome tie coat is comprised of chromium or a chromium-based alloy. The alloying metal is selected from Cu, Ni, Fe, V, Ti, Al, Si, Pd, Ta, W, Zn, In, Sn, Mn, Co and mixtures of two or more thereof. Preferred alloying metals include Cu, Fe, V, Ti and Ni. The chromium tie coat layer has a thickness in the range from about 30 Å to about 500 Å, and in one embodiment about 50 Å to about 300 Å.

The chrome tie coat layer may optionally have a copper seed coat layer adhered to it. The copper seed coat layer has a thickness from about 200 Å to about 20000 Å, and in one embodiment from about 1200 Å to about 5000 Å.

The nickel tie coat layer is comprised of nickel or a nickel-based alloy. The alloying metal is selected from Cu, Cr, Fe, V, Ti, Al, Si, Pd, Ta, W, Zn, In, Sn, Mn, Co and mixtures of two or more thereof. Preferred alloying metals include Cu, Fe, V, Ti and Cr. The nickel tie coat layer has a thickness in the range from about 30 Å to about 500 Å, and in one embodiment about 50 Å to about 300 Å.

The nickel tie coat layer may optionally have a copper seed coat layer adhered to it. The copper seed coat layer has a thickness from about 200 Å to about 20000 Å, and in one embodiment from about 1200 Å to about 5000 Å.

The tie coat can be formed or deposited using any of the vapor deposition techniques known to those skilled in the art, and such techniques include physical vapor deposition (PVD) and chemical vapor deposition (CVD). In thermal evaporation deposition procedures, the metallic material for deposition is heated in a high vacuum (e.g., a base pressure of less than about 1 mTorr, and in one embodiment a base pressure of about 0.001 mTorr) whereupon the metallic material evaporates or sublimates and travels to the substrate. Chemical vapor deposition usually is accomplished by vaporizing a metallic halide and decomposing or reacting the vapors at the substrate surface to yield the non-volatile metal on the surface of the substrate as a coating.

Sputtering is a useful vapor deposition technique for depositing a tie coat. This technique involves a material transport phenomenon caused by energetic atoms or ions striking a cathode target, causing the material making up the cathode target to be transferred to a vapor state through a momentum transfer mechanism, and subsequently to a different surface. The substrate to be coated is placed adjacent to a cathode. The cathode target is made of the substance which forms the coating. The cathode is subjected to a high negative voltage and is placed in an inert gas atmosphere at low pressure. Under the influence of the high voltage, atmospheric ions are accelerated against the surface of the cathode target wherein the momentum of the ions is transferred to atoms on the surface of the cathode target, ejecting the atoms from the surface of the cathode target and causing them to contact and adhere to the adjacent substrate. The inert gases that are useful include helium, neon, argon, krypton, xenon, and the like.

The metal for deposition is at least one of Cr, a Cr based alloy, Ni and a Ni based alloy. Useful alloying metals include Cu, Cr, Fe, V, Ti, Al, Ni, Si, Pd, Ta, W, Z, In, Sn, Mn, Co, and combinations of two or more thereof. Preferred alloying metals include Cu, Fe, Cr, Ni and V. Commercially available Ni alloys that are particularly useful include Monel (about 67% Ni, 30% Cu), Inconel about (76% Ni, 16% Cr, 8% Fe), Nickel "A" (about 99.4% Ni+Co), Nickel "D" (about 95% Ni, 4.5% Mn), Duranickel (about 94% Ni, 4.5% Al), Cast Nickel (about 97% Ni, 1.5% Si), "K" Monel (about 66% Ni, 29% Cu, 3% Al), Monel (cast) (about 63% Ni, 30% Cu, 1.5% Si), "H" Monel (cast) (about 63% Ni, 30% Cu, 3% Si), "S" Monel (cast) (about 63% Ni, 30% Cu, 4% Si), Inconel (cast) (about 72% Ni, 16% Cr, 8% Fe, 2% Si), Ni-o-nel (about 42% Ni, 30% Fe, 22% Cr, 3% Mo, 2% Cu, 1% Ti), Hastelloy Alloy B (about 62% Ni, 28% Mo, 5% Fe), Hastelloy Alloy C (about 54% Ni, 17% Mo, 15% Cr, 5% Fe, 4% W), Hastelloy Alloy D (about 85% Ni, 10% Si, 3% Cu), Hastelloy Alloy F (about 47% Ni, 22% Cr, 7% Mo, 17% Fe), Hastelloy Alloy N (about 70% Ni, 17% Mo, 7% Cr, 5% Fe), Hastelloy Alloy W (about 62% Ni, 24.5% Mo, 5% Cr, 5.5% Fe), Hastelloy Alloy X (about 47% Ni, 22% Cr, 9% Mo, 18% Fe), Illium B (about 50% Ni, 28% Cr, 8.5% Mo, 5.5% Cu), Illium G (about 56% Ni, 22.5% Cr, 6.5% Mo, 6.5% Cu), Illium R (about 68% Ni, 21% Cr, 5% Mo, 3% Cu), Illium 98 (about 55% Ni, 28% Cr, 8.5% Mo, 5.5% Cu), (about 80% Ni, 20% Cr), (about 60% Ni, 24% Fe, 16% Cr), (about 35% Ni, 45% Fe, 20% Cr), (about 45% Ni, 55% Cu), and the like. The pressure is in the range of about 1.5 to about 15 mTorr, and in one embodiment about 2.5 to about 10 mTorr.

For depositing the optional copper seed layer, the pressure is in the range of about 1.5 to about 15 mTorr, and in one embodiment about 2.5 to about 10 mTorr. The thickness of the copper seed coat layer that is deposited is from about 200 Å to about 20000 Å, and in one embodiment about 1200 Å to about 5000 Å.

EXAMPLE 11

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that, in addition to the acidic copper sulfate treatment, a copper seed layer having a thickness of about 2000 Å is deposited via PVD one side of the copper layer under 8 mTorr of pressure. Next, a chromium layer having a thickness of about 250 Å is deposited via PVD over the copper seed layer under 8 mTorr of pressure.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 45,000,000 cycles and extensive microcracking (some through the copper foil) at 55,000,000 cycles.

EXAMPLE 12

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 1 except that, in addition to the acidic copper sulfate treatment, a copper seed layer having a thickness of about 2000 Å is deposited via PVD one side of the copper layer under 8 mTorr of pressure. Next, a nickel alloy layer having a thickness of about 250 Å is deposited via PVD over the copper seed layer under 8 mTorr of pressure using Hastelloy Alloy D as a metal source.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 50,000,000 cycles and extensive microcracking (some through the copper foil) at 60,000,000 cycles.

The copper treatment involving a silane treatment involves depositing at least one silane compound on the copper layer of the flexible circuit in combination with one of the preceding copper treatments, except for the tie coat treatment. The copper treatment involving the silane treatment functions to absorb locally imposed energy thereby dissipating energy that may be transferred to the copper layer.

In one embodiment, the silane treatment involves depositing one silane compound on an otherwise untreated copper layer. The silane treatment is performed by applying one of the following silane coupling agents to the copper foil. The silane coupling agent can be represented by the formula

wherein R is a functionally substituted hydrocarbon group, the functional substituent of said functionally substituted hydrocarbon group being amino, hydroxy, halo, mercapto, alkoxy, acyl, or epoxy; X is a hydrolyzable group, such as alkoxy (e.g., methoxy, ethoxy, etc.), hydroxy group, or halogen (e.g., chlorine); and n is 1, 2 or 3, and preferably n is 3. The silane coupling agents represented by the above formula include halosilanes, aminoalkoxysilanes, aminophenylsilanes, phenylsilanes, heterocyclic silanes, N-heterocyclic silanes, acrylic silanes, mercapto silanes, and mixture of two or more thereof.

The silane coupling agent can be represented by the formula

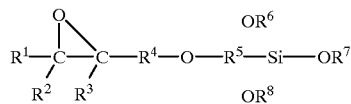

wherein: $R^1$, $R^2$ and $R^3$ are independently hydrogen or hydrocarbon groups; $R^4$ and $R^5$ are independently alkylene or alkylidene groups; and $R^6$, $R^7$ and $R^8$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl. The alkylene or alkylidene groups $R^4$ and $R^5$ preferably contain from 1 to about 10 carbon atoms, more preferably 1 to about 6 carbon atoms, more preferably 1 to about 4 carbon atoms, more preferably 1 or 2 carbon atoms. The alkylene and alkylidene groups can be methylene, ethylene, propylene, etc. In one embodiment, the silane coupling agent is a compound represented by the formula

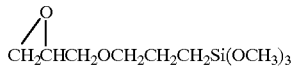

The silane coupling agent can be represented by the formula

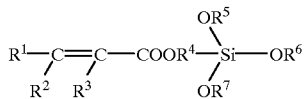

wherein: $R^1$, $R^2$ and $R^3$ are independently hydrogen or hydrocarbon groups; $R^4$ is an alkylene or alkylidene group; and $R^5$, $R^6$ and $R^7$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. The alkylene groups include methylene, ethylene, propylene, etc. In one embodiment, the silane coupling agent is a compound represented by the formula

The silane coupling agent can be represented by the formula

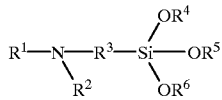

wherein: $R^1$ and $R^2$ are independently hydrogen or hydrocarbon groups; $R^3$ is an alkylene or alkylidene group; and $R^4$, $R^5$ and $R^6$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. The alkylene groups include methylene, ethylene, propylene, etc. In one embodiment this compound is represented by the formula

The silane coupling agent can be represented by the formula

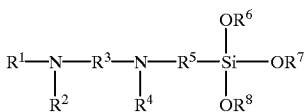

wherein: $R^1$, $R^2$ and $R^4$ are independently hydrogen or hydrocarbon groups; $R^3$ and $R^5$ are independently alkylene or alkylidene groups; and $R^6$, $R^7$ and $R^8$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. The alkylene groups include methylene, ethylene, propylene, etc. In one embodiment this compound is represented by the formula

The silane coupling agent can be represented by the formula

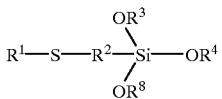

wherein $R^1$ is hydrogen or a hydrocarbon group; $R^2$ is an alkylene or alkylidene group; and $R^3$, $R^4$ and $R^5$ are independently hydrocarbon groups. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. These groups are preferably alkylene (e.g., methylene, ethylene, propylene, etc.). In one embodiment, this compound is represented by the formula

The silane coupling agent can be represented by the formula

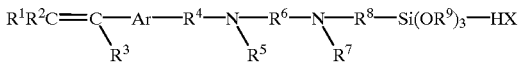

wherein: $R^1$, $R^2$, $R^3$, $R^5$ and $R^7$ are independently hydrogen or hydrocarbon groups; $R^4$, $R^6$ and $R^8$ are independently alkylene or alkylidene groups; each $R^9$ is independently a hydrocarbon group; Ar is an aromatic group; and X is a halogen. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene groups preferably contain from 1 to about 10 carbon atoms, more preferably 1 to about 6 carbon atoms, more preferably 1 to about 4 carbon atoms. These groups are preferably alkylene (e.g., methylene, ethylene, propylene, etc.). The aromatic group Ar can be mononuclear (e.g., phenylene) or polynuclear (e.g., naphthylene) with the mononuclear groups and especially phenylene being preferred. The halogen, X, is preferably chlorine or bromine, more preferably chlorine. In one embodiment this compound is represented by the formula

The silane coupling agent can be represented by the formula

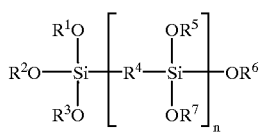

wherein $R^1$, $R^2$, $R^3$, $R^5$, $R^6$ and $R^7$ are independently hydrocarbon groups; $R^4$ is an alkylene or alkylidene group; and n is 0 or 1. The hydrocarbon groups preferably contain 1 to about 10 carbon atoms, more preferably 1 to about 6 carbon atoms, more preferably 1 to about 4 carbon atoms. These hydrocarbon groups are preferably alkyl (e.g., methyl, ethyl, propyl, etc.). The alkylene and alkylidene group preferably contains from 1 to about 10 carbon atoms, more preferably 1 to about 6 carbon atoms, more preferably 1 to about 4 carbon atoms. This group is preferably alkylene (e.g., methylene, ethylene, propylene, etc.). In one embodiment this compound is represented by the formula

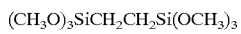

In one embodiment this compound is tetraethoxysilane.

Examples of useful silane coupling agents include N-(2-aminoethyl)-3-aminopropyl trimethoxysilane; 3-(N-styrylmethyl-2-aminoethylamino) propyl trimethoxysilane; 3-aminopropyl triethoxysilane; bis(2-hydroxyethyl)-3-aminopropyltriethoxysilane; β-(3,4-epoxy cyclohexyl)ethyl trimethoxysilane; 3-glycidoxypropyl trimethoxysilane; 3-methacryloxypropyl trimethoxysilane; 3-chloropropyl trimethoxysilane; vinyl trichlorosilane; vinyl triethoxysilane; vinyl-tris(2-methoxyethoxy)silane; aminopropyl trimethoxysilane; N-methylaminopropyl trimethoxysilane; and N-phenylaminopropyl trimethoxysilane.

The silane coupling agents also include N-(3-acryloxy-2-hydroxypropyl)-3-aminopropyl triethoxysilane, 3-acryloxypropyl trimethoxysilane, allyl triethoxysilane, allyl trimethoxysilane, 4-aminobutyl triethoxysilane, (aminoethylaminomethyl) phenethyl trimethoxysilane, N-(2-aminoethyl-3-aminopropyl) trimethoxysilane, N-(2-aminoethyl-3-aminopropyl) tris (2-ethylhexoxy)silane, 6-(aminohexylaminopropyl) trimethoxysilane, aminophenyl trimethoxysilane, 3-(1-aminopropoxy)-3,3-dimethyl-1-propenyl trimethoxysilane, 3-aminopropyltris (methoxyethoxyethoxy) silane, 3-aminopropyl triethoxy silane, 3-aminopropyl trimethoxy silane, ω-aminoundecyl trimethoxy silane, 3-[2-N-benzylaminoethylaminopropyl] trimethoxy silane, bis(2-hydroxyethyl)-3-aminopropyl triethoxy silane, 8-bromooctyl trimethoxy silane, bromophenyl trimethoxy silane, 3-bromopropyl trimethoxy silane, p-(chloromethyl) phenyl trimethoxy silane, chloromethyl triethoxy silane, chlorophenyl triethoxy silane, 3-chloropropyl triethoxy silane, 3-chloropropyl trimethoxy silane, 2-cyanoethyl triethoxy silane, 2-cyanoethyl trimethoxy silane, (cyanomethylphenethyl) trimethoxy silane, 3-cyanopropyl triethoxy silane, 3-cyclopentadienylpropyl triethoxy silane, (N,N-diethyl-3-aminopropyl) trimethoxy silane, diethylphosphatoethyl triethoxy silane, (N,N-dimethyl-3-aminopropyl) trimethoxy silane, 2-(diphenylphosphino) ethyl triethoxy silane, 2-(3,4- epoxycyclohexyl) ethyl trimethoxy silane, 3-iodopropyl trimethoxy silane, 3-isocyanatopropyl triethoxy silane, 3-mercaptopropyl triethoxy silane, 3-mercaptopropyl trimethoxy silane, 3-methacryloxypropyl trimethoxy silane, 3-methacryloxypropyltris (methoxyethoxy) silane, 3-methoxypropyl trimethoxy silane, N-methylaminopropyl trimethoxy silane, N-phenethyl-N'-triethoxysilyl propylurea, N-phenylaminopropyl trimethoxy silane, 3-(N-styrylmethyl-2-aminoethylamino)propyl trimethoxy silane, 3-thiocyanatopropyl triethoxy silane, N-(3-triethoxysilylpropyl) acetylglycinamide, triethoxysilylpropylethyl carbamate, N-[3-(triethoxysilyl)propyl]-4,5-dihydroimidazole, N-triethoxysilylpropyl-o-menthocarbamate, N-[3-(triethoxysilyl)propyl] phthalamic acid, N-(triethoxysilylpropyl) urea, 1-trimethoxysilyl-2-(p, m-chloromethyl)-phenylethane, β-trimethoxysilylethyl-2-pyridine, N(3-trimethoxysilylpropyl)-N-methyl-N,N-diallylammonium chloride, trimethoxysilylpropyldiethylenetriamine, N-[(3-trimethoxysilyl)propyl] ethylenediamine triacetic acid trisodium salt, trimethoxysilylpropylisothiouronium chloride, N-(3-trimethoxysilylpropyl) pyrrole, N-trimethoxysilylpropyl tri-N-butylammonium bromide, and N-trimethoxysilylpropyl-N,N,N-trimethylammonium chloride. The silane coupling agents also include vinyl triethoxy silane, vinyl triisopropoxy silane, vinyl trimethoxy silane, vinyl tris-t-butoxy silane, vinyl tris (2-methoxyethoxy) silane, vinyl triisopropenoxy silane, and vinyl tris (t-butylperoxy) silane.

The silane coupling agents further include 2-acetoxyethyl trichloro silane, 3-acryloxypropyl trichloro silane, allyltrichloro silane, 8-bromooctyl trichloro silane, bromophenyl trichloro silane, 3-bromopropyl trichloro silane, 2-(carbomethoxy) ethyl trichloro silane, 1-chloroethyl trichloro silane, 2-chloroethyl trichloro silane, p-(chloromethyl) phenyl trichloro silane, chloromethyl trichloro silane, chlorophenyl trichloro silane, 3-chloropropyl trichloro silane,(3-cyanobutyl) trichloro silane, 2-cyanoethyl trichloro silane, 3-cyanopropyl trichloro silane, (dichloromethyl) trichloro silane, (dichlorophenyl) trichloro silane, 6-hex-1-enyl trichloro silane, 3-methacryloxypropyl trichloro silane, 3-(4-methoxyphenyl)propyl trichloro silane, 7-oct-1-enyl trichloro silane, 3-(N-phthalimido) propyl trichloro silane, 1-trichlorosilyl-2-(p,m-chloromethylphenyl) ethane, 4-[2-(trichlorosilyl)ethyl]cyclohexene, 2-[2-(trichlorosilyl)ethyl] pyridine, 4-[2-(trichlorosilyl)ethyl] pyridine, 3-(trichlorosilyl)propylchloroformate, and vinyl trichloro silane.

Especially useful silane coupling agents include aminopropyltrimethoxy silane, tetraethoxy silane, bis(2-hydroxyethyl)-3-aminopropyltriethoxy silane, 3-(N-styrylmethyl-2-aminoethylamine) propyltrimethoxy silane, 3-glycidoxypropyltrimethoxy silane, N-methylaminopropyltrimethoxy silane, 2-(2-aminoethyl-3-aminopropyl)trimethoxy silane, and N-phenylaminopropyltrimethoxy silane.

In one embodiment the silane coupling agent is other than 3-glycidoxy-propyltrimethoxy silane.

In another embodiment, the silane treatment involves depositing two or more silane compounds. Of the two or more silanes, one is typically silane (A) and the other is silane (B) as represented below.

Silane (A) is a compound represented by the formula

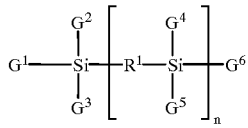

wherein $G^1$, $G^2$, $G^3$, $G^4$, $G^5$ and $G^6$ are independently halogen, hydrocarbyloxy, or hydroxy groups; $R^1$ is a hydrocarbon group or nitrogen-containing hydrocarbon group; and n is zero or 1. In one embodiment each of $G^1$, $G^2$, $G^3$, $G^4$, $G^5$ and $G^6$ is independently chloro, alkoxy, alkoxyalkoxy or alkoxyalkoxyalkoxy, and $R^1$ is an alkylene or an arene group of up to about 10 carbon atoms, or a monoamino- or polyamino-substituted alkylene or arene group of up to about 10 carbon atoms. In one embodiment each of $G^1$, $G^2$, $G^3$ and $G^6$ is an alkoxy, alkylalkoxy, alkoxyalkoxy or alkoxyalkoxyalkoxy group of up to about 10 carbon atoms, and n is zero.

Examples of silane (A) include tetramethoxysilane, tetraethoxysilane, tetrapropoxysilane, tetra-n-butoxysilane, tetrakis(2-ethoxyethoxy)silane, tetrakis(2-ethylbutoxy) silane, tetrakis(2-ethylhexoxy)silane, tetrakis (methoxyethoxyethoxy)silane, tetrakis(2-methoxyethoxy) silane, tetrakis(1-methoxy-2-propoxy)silane, bis[3-(triethoxysilyl)propyl] amine, bis[3-(trimethoxysilyl) propyl]ethylenediamine, 1,2-bis(trimethoxysilyl)ethane, bis (trimethoxysilylethyl)benzene, 1,6-bis(trimethoxysilyl) hexane, 1,2-bis(trichlorosilyl)ethane, 1,6-bis(trichlorosilyl) hexane, and 1,8-bis(trichlorosilyl)octane.

Silane (B) is a compound represented by the formula

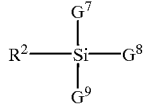

wherein $R^2$ is an organofunctional group; and $G^7$, $G^8$ and $G^9$ are independently halogen, hydrocarbyloxy, or hydroxy groups. In one embodiment, $R^2$ is an amino-, hydroxy-, and/or alkoxy-containing hydrocarbon group. In one embodiment each of $G^7$, $G^8$ and $G^9$ is chloro, methoxy or ethoxy.

Examples of silane (B) include N-(2-aminoethyl)-3-aminopropyl trimethoxy silane; 3-(N-styrylmethyl-2-aminoethylamino) propyl trimethoxy silane; 3-aminopropyl triethoxy silane; bis(2-hydroxyethyl)-3-aminopropyl triethoxy silane; β-(3,4-epoxy cyclohexyl)ethyl trimethoxy silane; 3-glycidoxypropyltrimethoxy silane; 3-methacryloxypropyl trimethoxy silane; 3-chloropropyl trimethoxy silane; vinyl trichloro silane; vinyl triethoxy silane; vinyl-tris(2-methoxyethoxy) silane; aminopropyl trimethoxy silane; N-methyl amino propyl trimethoxy silane; and N-phenylaminopropyl trimethoxy silane.

Examples of silane (B) also include N-(3-acryloxy-2-hydroxypropyl)-3-aminopropyl triethoxy silane, 3-acryloxypropyl trimethoxy silane, allyl triethoxy silane, allyl trimethoxy silane, 4-aminobutyl triethoxy silane, (aminoethylaminomethyl) phenethyl trimethoxy silane, N-(2-aminoethyl-3-aminopropyl) trimethoxy silane, N-(2-aminoethyl-3-aminopropyl) tris (2-ethylhexoxy) silane, 6-(aminohexylaminopropyl) trimethoxy silane, aminophenyl trimethoxy silane, 3-(1-aminopropoxy)-3,3-dimethyl-1-propenyl trimethoxy silane, 3-aminopropyltris (methoxyethoxyethoxy) silane, 3-aminopropyl triethoxy silane, 3-aminopropyl trimethoxy silane, ω-aminoundecyl trimethoxy silane, 3-[2-N-benzylaminoethylaminopropyl] trimethoxy silane, bis(2-hydroxyethyl)-3-aminopropyl triethoxy silane, 8-bromooctyl trimethoxy silane, bromophenyl trimethoxy silane, 3-bromopropyl trimethoxy silane, p-(chloromethyl) phenyl trimethoxy silane, chloromethyl triethoxy silane, chlorophenyl triethoxy silane, 3-chloropropyl triethoxy silane, 3-chloropropyl trimethoxy silane, 2-cyanoethyl triethoxy silane, 2-cyanoethyl trimethoxy silane, (cyanomethylphenethyl) trimethoxy silane, 3-cyanopropyl triethoxy silane, 3-cyclopentadienylpropyl triethoxy silane, (N,N-diethyl-3-aminopropyl) trimethoxy silane, diethylphosphatoethyl triethoxy silane, (N,N-dimethyl-3-aminopropyl) trimethoxy silane, 2-(diphenylphosphino) ethyl triethoxy silane, 2-(3,4-epoxycyclohexyl) ethyl trimethoxy silane, 3-iodopropyl trimethoxy silane, 3-isocyanatopropyl triethoxy silane, 3-mercaptopropyl triethoxy silane, 3-mercaptopropyl trimethoxy silane, 3-methacryloxypropyl trimethoxy silane, 3-methacryloxypropyltris (methoxyethoxy) silane, 3-methoxypropyl trimethoxy silane, N-methylaminopropyl trimethoxy silane, N-phenethyl-N'-triethoxysilyl propylurea, N-phenylaminopropyl trimethoxy silane, 3-(N-styrylmethyl-2-aminoethylamino)propyl trimethoxy silane, 3-thiocyanatopropyl triethoxy silane, N-(3-triethoxysilylpropyl) acetylglycinamide, triethoxysilylpropylethyl carbamate, N-[3-(triethoxysilyl)propyl]-4,5-dihydroimidazole, N-triethoxysilylpropyl-o-menthocarbamate, N-[3-(triethoxysilyl)propyl] phthalamic acid, N-(triethoxysilylpropyl) urea, 1-trimethoxysilyl-2-(p, m-chloromethyl)-phenylethane, β-trimethoxysilyl ethyl-2-pyridine, N(3-trimethoxysilylpropyl)-N-methyl-N,N-diallylammonium chloride, trimethoxysilylpropyldiethylenetriamine, N-[(3-trimethoxysilyl)propyl] ethylenediamine triacetic acid trisodium salt, trimethoxysilylpropylisothiouronium chloride, N-(3-trimethoxysilylpropyl) pyrrole, N-trimethoxysilylpropyl tri-N-butylammonium bromide, and N-trimethoxysilylpropyl-N,N,N-trimethylammonium chloride. Examples of silane (B) also include vinyl triethoxy silane, vinyl triisopropoxy silane, vinyl trimethoxy silane, vinyl tris-t-butoxy silane, vinyl tris (2-methoxyethoxy) silane, vinyl triisopropenoxy silane, and vinyl tris (t-butylperoxy) silane.

Examples of silane (B) further include 2-acetoxyethyl trichloro silane, 3-acryloxypropyl trichloro silane, allyl-trichloro silane, 8-bromooctyl trichloro silane, bromophenyl trichloro silane, 3-bromopropyl trichloro silane, 2-(carbomethoxy) ethyl trichloro silane, 1-chloroethyl trichloro silane, 2-chloroethyl trichloro silane, p-(chloromethyl) phenyl trichloro silane, chloromethyl trichloro silane, chlorophenyl trichloro silane, 3-chloropropyl trichloro silane,(3-cyanobutyl) trichloro silane, 2-cyanoethyl trichloro silane, 3-cyanopropyl trichloro silane, (dichloromethyl) trichloro silane, (dichlorophenyl) trichloro silane, 6-hex-1-enyl trichloro silane, 3-methacryloxypropyl trichloro silane, 3-(4-methoxyphenyl)propyl trichloro silane, 7-oct-1-enyl trichloro silane, 3-(N-phthalimido) propyl trichloro silane, 1-trichlorosilyl-2-(p,m-chloromethylphenyl)ethane4-[2-trichlorosilyl)ethyl] cyclohexene, 2-[2-(trichlorosilyl)ethyl] pyridine, 4-[2-(trichlorosilyl)ethyl] pyridine, 3-(trichlorosilyl)propylchloroformate, and vinyl trichloro silane.

In one embodiment the weight ratio between silane (A) and silane (B) is preferably from about 5:95 to about 95:5, and more preferably from about 10:90 to about 90:10.

In one embodiment the two silane surface treatment is derived from a composition comprising N-(2-aminoethyl-3-aminopropyl) trimethoxy silane, 3-aminopropyl trimethoxy silane or 3-glycidoxypropyltrimethoxy silane in combination with tetraethoxy silane or tetramethoxysilane.

The application of the two silane surface treatment to the copper foil can be effected by applying a neat mixture of the silanes (A) and (B) to the surface of the foil. However, it is generally preferred to mix the silanes in a suitable medium prior to applying them to the foil surface. The silane or silanes can either be mixed in one step with the medium; or they can be mixed separately with the medium, and then the resulting mixtures are combined prior to application to the foil surface. Alternatively, the separate solutions can be applied sequentially to the copper, with or without drying between applications. The silane mixture can be applied to the foil surface in the form of a dispersion or solution in water, a mixture of water and alcohol, or a suitable organic solvent, or as an aqueous emulsion of the silane mixture, or as an aqueous emulsion of a solution of the silane mixture in a suitable organic solvent. Conventional organic solvents may be used. These include alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the silane or silane mixture may be formed in conventional manner using conventional dispersants and surfactants, including nonionic dispersants. The concentration of the silane or silane mixture in such solutions or emulsions can be up to about 100% by weight of such silanes, but preferably is in the range of about 0.1% to about 5% by weight. The one or two silane surface treatment may be applied to the foil surface using known application methods which include reverse roller coating, doctor blade coating, dipping, painting and spraying.

The application of the one or two silane surface treatment to the foil surface is typically effected at a temperature from about 15° C. to about 45° C., and preferably about 20° C. to about 30° C. Following application of the silane surface treatment to the foil surface, the foil can be heated to a temperature from about 60° C. to about 170° C., for preferably about 0.03 to about 5 minutes to enhance drying of the surface. The dry film thickness of the silane surface treatment on the foil is preferably from about 0.002 to about 0.1 microns, and more preferably about 0.005 to about 0.02 microns.

EXAMPLE 13

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 4 except that, in addition to the oxidation treatment, one side of the copper layer is contacted with an aqueous solution containing about 2% by weight of 3-aminopropyl triethoxysilane at 25° C. and then heated at 100° C. for 5 minutes.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 20,000,000 cycles and extensive microcracking (some through the copper foil) at 30,000,000 cycles.

EXAMPLE 14

Two flexible laminates are provided, one conventional and one according to the present invention. The first flexible laminate (conventional) is the same as the first flexible laminate disclosed in Example 1. The second flexible laminate (according to the present invention) is the same as the second flexible laminate of Example 4 except that, in addition to the oxidation treatment, one side of the copper layer is contacted with an aqueous solution containing about 0.75% by weight of N-(2-aminoethyl-3-aminopropyl) trimethoxy silane and about 0.75% by weight of tetramethoxysilane at 25° C. and then heated at 100° C. for 5 minutes.

The flexible laminates are subjected to bending cycles similar to that shown in FIG. 1. At intervals of 5,000,000 cycles, the copper foil is examined under magnification of about 1600× to determine the presence and extent of microcracking. The first flexible laminate displays some microcracking at 5,000,000 cycles and extensive microcracking (some through the copper foil) at 10,000,000 cycles. The second flexible laminate displays some microcracking at 25,000,000 cycles and extensive microcracking (some through the copper foil) at 35,000,000 cycles.

In some embodiments, it is preferable to use more than one copper foil treatment to prevent microcracking. For example, in one embodiment, a copper foil is subjected to a cathodic treatment in an acidic copper sulfate bath followed by a silane treatment. In another embodiment, a copper foil is subjected to a zinc deposition followed by a cathodic treatment in a chromate bath again followed by a silane treatment. In yet another embodiment, a copper foil is subjected to a cathodic treatment in an acid bath containing zinc ions, chromate ions and a hydrogen inhibitor followed by a silane treatment. In still yet another embodiment, a copper foil is subjected to oxidation in aerated water followed by a cathodic treatment in an acid bath containing zinc ions, chromate ions and a hydrogen inhibitor again followed by a silane treatment. In another embodiment, a copper foil is subjected to brown or black oxidation followed by application of chrome based tie coat layer. Generally speaking, it is preferable to combine either a metal based treatment or an oxidizing treatment with the silane treatment.

The inventive flexible circuits contain at least one and typically two polymeric substrates which are flexible polymeric films. The flexible polymeric substrate contains at least one of a thermosetting resin and a thermoplastic resin, but typically at least one of a polyester resin, a polyimide resin, and a condensation polymer. The flexible substrate has a thickness in the range of up to about 0.2 mm, and in one embodiment from about 5 $\mu$m to about 0.15 mm, and in another embodiment about 10 $\mu$m to about 5000 $\mu$m, and in yet another embodiment about 15 $\mu$m to about 1000 $\mu$m. The flexible substrate can be made with or without fillers, woven glass, non-woven glass and/or other fibrous materials. The flexible substrate can be a single layered film or a multi-layered film.

The thermosetting resins that can be used to form the flexible substrate include phenolic resins, phenol-aldehyde resins, furan resins, amino-plast resins, alkyd resins, allyl resins, epoxy resins, epoxy prepregs, polyurethane resins, thermosetting polyester resins, polyimide bis-maleimide resins, polymaleimide-epoxy resins, polymaleimide-isocyanate resins, silicone resins, cyanate resins, cyanate-epoxy resins, cyanate-polymaleimide resins, cyanate-epoxy-polymaleimide resins, bismaleimide triazine resins, and the like.

The thermoplastic resins include poly alpha-olefins, polyethylene, polypropylene, poly 4-methyl-pentene-1, ethylene/vinyl copolymers, ethylene vinyl acetate copolymers, ethylene acrylic acid copolymers, ethylene methacrylate copolymers, ethylmethylacrylate copolymers, etc.; thermoplastic propylene polymers such as polypropylene, ethylene-propylene copolymers, etc.; vinyl chloride polymers and copolymers; vinylidene chloride polymers and copolymers; polyvinyl alcohols; acrylic polymers made from acrylic acid, methacrylic acid, methylacrylate, methacrylate, acrylamide, and the like; polyesters; polyimides; condensation polymers; fluorocarbon resins such as polytetrafluoroethylene, polyvinylidiene fluoride, and fluorinated ethylenepropylene resins; styrene resins such as a polystyrene, alpha-methylstyrene, high impact polystyrene, acrylonitrilebutadiene-styrene polymers, and the like.

The polyester resins include those made from dibasic aliphatic and aromatic carboxylic acids and diols or triols. These include polyethylene teraphthlate, polyethylene naphtalate, polybutylene teraphthlate, and the like. The polycarbonates, which are long chained linear polyesters derived from carbonic acids (e.g., phosgene) and dihydric phenols (e.g., bisphenol A), can be used.

The polyimide resins are particularly useful for the flexible substrate. These can be made by a reaction involving contacting a tetrabasic acid dianhydride with an aromatic diamine giving first a polyamic acid which is then converted by heat or catalyst into a high molecular weight linear polyimide.

The condensation polymers that are useful include the polyamides, polyetherimides, polysulfones, polyethersulfones, polybenzazoles, aromatic polysulfones, polyphenylene oxides, polyether ether ketones, and the like.

Preferred materials for the flexible substrate are polyester film materials such as polyethylene terephthalates and polybutylene terephthalates, and the polyimides. These film materials are sold by DuPont, Allied-Apical, Teijin, Kanegafuchi and Ube Industries, under various tradenames including Mylar®, Kapton®, Apical® and Upilex®.

The flexible substrate may or may not be treated before a copper layer is affixed thereto. For example, an adhesion promoter such as an adhesive may be applied to the flexible substrate to enhance adhesion with the copper layer. Examples of adhesives that can be used include epoxy based adhesives, polyimide based adhesives and acrylic based adhesives. These can be used alone or in combination with phenolics or polyvinylbutyral resins. The adhesive has a thickness in the range of up to about 0.1 mm, and in one embodiment from about 5 $\mu$m to about 5000 $\mu$m, and in another embodiment about 10 $\mu$m to about 1000 $\mu$m, and in yet another embodiment about 15 $\mu$m to about 500 $\mu$m.

A copper layer is laminated to or deposited over the treated or untreated flexible substrate. An adhesion promoter may or may not be present in between the copper foil and flexible substrate. The copper layer deposited can be preformed copper foil or formed using a variety of known techniques, including electroplating, electroless plating and vapor deposition or a combination thereof. The copper layer has a thickness up to about 70 $\mu$m, and in one embodiment in the range from about 2 to about 60 $\mu$m, and in another embodiment from about 5 to about 40 $\mu$m. In one embodiment, this copper layer has a thickness of about 5 $\mu$m, and in one embodiment about 10 $\mu$m, and in one embodiment about 15 $\mu$m, and in one embodiment about 18 $\mu$m, and in one embodiment the thickness is about 35 $\mu$m.

Electroplating involves the electrodeposition of metallic coating on an electrode surface to form a metal deposit. The electrode surface being treated is made the cathode in an electroplating solution or bath. Such baths are typically aqueous solutions from which metal is reduced by the flow of an electric current through a solution of the metal salt. In performing electroplating of metal on a conductive electrode, the electrode or substrate is often cleaned, rinsed, dipped in acid or is subject to other pretreatment or substrate preparation. In operating an electroplating process, the substrate is immersed into a solution and necessary electric current is applied typically from metallic anodes to the substrate cathode. The solutions are often agitated and the temperature, electric current, metal concentration and other variables are closely controlled using well known principles.

Copper layers can also be formed using electroless plating, which is a controlled autocatalytic deposition of a continuous film by the interaction, in a solution of metal salt, between a metal and a chemical reducing agent. Electroless deposition can give films of metals, alloys, metallic compounds, and composites on both conductive and non-conductive surfaces. Electroless solutions contain a metal salt, a reducing agent, a pH adjuster or buffer, a complexing agent and one or more additives to control solution stability, film properties, deposition rates, etc. The advantage of electroless plating is the ability to plate metal on non-conductive or poorly conductive surfaces. Vapor deposition techniques, both PVD and CVD, may also be used to deposit copper having a thickness up to about 70 $\mu$m as discussed above.

Once the copper layer is affixed to one flexible substrate, a flexible printed wiring board can be made by forming the circuit pattern. The circuit pattern can be formed using photolithography techniques including etching processes wherein a resist and etchant baths are used to selectively remove copper leaving a circuit pattern of patterned copper foil. Optionally, an adhesion promoter is applied to the exposed side of the copper foil, and another treated or untreated flexible substrate is affixed to the patterned copper foil clad laminate to form a flexible circuit.

The various treatments of the present invention can be carried out in a continuous manner using a single chamber which is divided into sections that are operated at pressures that are optimized for each treatment. The various treatments can also be carried out in a continuous manner using separate chambers for each treatment. The various treatments can also be carried out in a stepwise continuous manner using a single chamber and multiple passes through the chamber to provide for each of the processing steps.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A process for making a flexible laminate, comprising:
   providing a copper layer;
   treating the copper layer to prevent microcracking;
   affixing a first side of the copper layer to a first flexible polymeric film;
   patterning the copper layer; and
   affixing a second flexible polymeric film to a second side of the copper layer.

2. The process of claim 1 wherein treating the copper layer to prevent microcracking comprises contacting the copper layer with an acidic copper sulfate bath comprising from about 0.1 g/l to about 50 g/l of copper sulfate for a time sufficient to provide a microcracking prevention layer having a thickness from about 0.1 $\mu$m to about 10 $\mu$m.

3. A process for making a flexible laminate, comprising:
   providing a copper layer;
   treating the copper layer to prevent microcracking;
   affixing a first side of the copper layer to a first flexible polymeric film;
   patterning the copper layer; and
   affixing a second flexible polymeric film to a second side of the copper layer;
   wherein treating the copper layer to prevent microcracking comprises contacting the copper layer with an oxidant and optionally a hydroxide compound, the oxidant selected from ammonium nitrate, ammonium perchlorate, ammonium persulfate, tetramethylammonium nitrate, tetraethylammonium nitrate, sodium chlorite, sodium hypochlorite, sodium nitrate, sodium nitrite, sodium perborate, sodium percarbonate, sodium perchlorate, sodium periodate, sodium persulfate, potassium nitrate, potassium nitrite, potassium perborate, potassium perchlorate, potassium periodate, potassium persulfate, rubidium nitrate, rubidium perchlorate, magnesium nitrate, magnesium perchlorate, calcium hypochlorite, calcium nitrate, calcium perchlorate, strontium nitrate, strontium perchlorate, aerated water and oxygen plasma.

4. The process of claim 1 wherein treating the copper layer to prevent microcracking comprises contacting the copper layer with a chromate solution comprising about 0.1 g/l to about 10 g/l of chromate for a time from about 1 second to about 100 seconds.

5. The process of claim 1 wherein treating the copper layer to prevent microcracking comprises contacting the copper layer with a cathodic chrome electrolytic bath comprising about 0.1 g/l to about 5 g/l of a chromium compound under a current density from about 10 amps/ft$^2$ to about 40 amps/ft$^2$ for a time from about 2 seconds to about 20 seconds.

6. The process of claim 1 wherein treating the copper layer to prevent microcracking comprises contacting the copper layer with a cathodic chrome electrolytic bath comprising about 0.1 g/l to about 2 g/l of zinc ions, about 0.3 g/l to about 5 g/l of chromium ions, and about 5 ppm to about 1000 ppm of a hydrogen inhibitor under a current density from about 1 amps/ft$^2$ to about 100 amps/ft$^2$ for a time from about 1 second to about 30 seconds.

7. A process for making a flexible laminate, comprising:
   providing a copper layer;
   treating the copper layer to prevent microcracking;
   affixing a first side of the copper layer to a first flexible polymeric film;
   patterning the copper layer; and
   affixing a second flexible polymeric film to a second side of the copper layer;
   wherein treating the copper layer to prevent microcracking comprises forming an oxide layer on the copper layer using at least one of ammonium nitrate, ammonium perchlorate, ammonium persulfate, tetramethylammonium nitrate, tetraethylammonium nitrate, sodium chlorite, sodium hypochlorite, sodium nitrate, sodium nitrite, sodium perborate, sodium percarbonate, sodium perchlorate, sodium periodate, sodium persulfate, potassium nitrate, potassium nitrite, potassium perborate, potassium perchlorate, potassium periodate, potassium persulfate, rubidium nitrate, rubidium perchlorate, magnesium nitrate, magnesium perchlorate, calcium hypochlorite, calcium nitrate, calcium perchlorate, strontium nitrate, strontium perchlorate, aerated water and oxygen plasma.

8. A process for making a flexible laminate, comprising:
   providing a copper layer;
   treating the copper layer to prevent microcracking;
   affixing a first side of the copper layer to a first flexible polymeric film;
   patterning the copper layer; and
   affixing a second flexible polymeric film to a second side of the copper layer, wherein treating the copper layer to prevent microcracking comprises:
depositing a zinc layer by vapor deposition on the copper layer; and
contacting the zinc layer with a hexavalent chromium oxide compound.

9. The process of claim 7 further comprising depositing by physical vapor deposition or chemical vapor deposition at least one of chromium and nickel and optionally one or more of Cu, Fe, V, Ti, Al, Si, Pd, Ta, W, Zn, In, Sn, Mn, and Co to form a tie coat layer having a thickness from about 30 Å to about 500 Å.

10. The process of claim 7 further comprising depositing one or more silane coupling agents on the oxidized copper layer.

11. A method of preventing microcracking in a copper layer having a thickness of up to about 18 $\mu$m during at least 50,000,000 bending cycles of a flexible circuit comprising a first flexible polymeric film, the copper layer, and a second flexible polymeric film, the flexible circuit optionally further comprises an adhesive between at least one of the copper layer and the first flexible polymeric film and the copper layer and the second flexible polymeric film, comprising:
treating at least one side of the copper layer with (1) a first treatment comprising one of a cathodic treatment in an acidic copper sulfate bath, an oxidizing treatment, a chromium treatment, and a cathodic treatment in an acid bath; and (2) a second treatment comprising one of a tie coat treatment and a silane treatment.

* * * * *